US012593733B2

(12) United States Patent
Chen et al.

(10) Patent No.: US 12,593,733 B2
(45) Date of Patent: Mar. 31, 2026

(54) VERTICAL LIGHT EMITTING DIODE DIE PACKAGING METHOD

(71) Applicant: Ingentec Corporation, Zhunan Township (TW)

(72) Inventors: Hsiao Lu Chen, Zhunan Township (TW); Ai Sen Liu, Zhunan Township (TW); Hsiang An Feng, Zhunan Township (TW)

(73) Assignee: INGENTEC CORPORATION, Zhunan Township (TW)

( * ) Notice: Subject to any disclaimer, the term of this patent is extended or adjusted under 35 U.S.C. 154(b) by 558 days.

(21) Appl. No.: 18/106,818

(22) Filed: Feb. 7, 2023

(65) Prior Publication Data

US 2024/0072013 A1 Feb. 29, 2024

(30) Foreign Application Priority Data

Aug. 31, 2022 (TW) .................................. 111133016

(51) Int. Cl.
*H01L 25/075* (2006.01)
*H10H 20/852* (2025.01)
(Continued)

(52) U.S. Cl.
CPC ....... *H01L 25/0753* (2013.01); *H10H 20/852* (2025.01); *H10H 20/857* (2025.01); *H10H 20/0362* (2025.01); *H10H 20/0364* (2025.01)

(58) Field of Classification Search
CPC .............. H01L 25/0753; H10H 20/852; H10H 20/857; H10H 20/0362; H10H 20/0364; H10H 20/01; H10H 20/85
See application file for complete search history.

(56) References Cited

U.S. PATENT DOCUMENTS

2011/0281138 A1* 11/2011 Yoshioka ................. H05K 1/11
                                                        428/815
2013/0033352 A1* 2/2013 Wo ......................... H02K 3/524
                                                        336/192
(Continued)

FOREIGN PATENT DOCUMENTS

CN        102282661 A     12/2011
CN        107112403 A     8/2017
(Continued)

*Primary Examiner* — Ratisha Mehta

(74) *Attorney, Agent, or Firm* — Birch, Stewart, Kolasch & Birch, LLP

(57) ABSTRACT

A vertical light emitting diode die packaging method is provided, including a plurality of following steps. At first, a plurality of drill hole is formed in a substrate and a first metal material is used to fill the drill holes. Next, disposing and fixing a plurality of vertical light emitting diode die on the substrate through a second metal material, and a transparent glue is used to cover thereon. A laser process is then employed to dissolve the transparent glue for forming ditches. And, a conductive liquid is applied to fill the ditches and an insulating glue is provided to embrace and encapsulate the vertical light emitting diode dies. By employing the packaging method of the present invention, the current external wire bonding process can be effectively replaced, thereby die size miniaturization as well as packaging yield of the vertical light emitting diode dies are believed to be optimized.

14 Claims, 9 Drawing Sheets

(51) Int. Cl.
    *H10H 20/857*    (2025.01)
    *H10H 20/01*    (2025.01)

(56)          References Cited

U.S. PATENT DOCUMENTS

| | | | | |
|---|---|---|---|---|
| 2015/0283374 A1* | 10/2015 | Kronmueller | ............ | H01G 4/35 174/650 |
| 2017/0317230 A1* | 11/2017 | An | ........................ | H10H 20/857 |
| 2020/0220513 A1* | 7/2020 | Vetury | ................. | H10N 30/877 |
| 2021/0315107 A1* | 10/2021 | Vasudevan | ........... | H05K 3/3489 |
| 2022/0182034 A1* | 6/2022 | Moe | .................. | H03H 9/02015 |

FOREIGN PATENT DOCUMENTS

| | | | |
|---|---|---|---|
| CN | 108122861 A | 6/2018 |
| CN | 110676223 A | 1/2020 |
| CN | 114220775 A | 3/2022 |

\* cited by examiner

VERTICAL LIGHT EMITTING DIODE DIE PACKAGING METHOD

This application claims priority of Application No. 111133016 filed in Taiwan on 31 Aug. 2022 under 35 U.S.C. § 119; the entire contents of all of which are hereby incorporated by reference.

BACKGROUND OF THE INVENTION

Field of the Invention

The present invention is related to a process method for packaging light emitting diode dies. And more particularly, it is related to a packaging process method for Vertical Light Emitting Diode Die, in which a laser process is employed for forming a ditch such that by filling the ditch with nano silver wires, it is effectively to replace the current external wire bonding process.

Description of the Prior Art

In general, as known, a Light Emitting Diode (LED) is a certain kind of light source which is fabricated using the semiconductor technology and formed by III-V group compound semiconductors. The LEDs normally operate based on a fact that electrons are combined with holes in a semiconductor to produce photons. The LEDs are different from the conventional light bulbs which must work at a high temperature of thousands of degrees. The LEDs are also different from fluorescent lamps which must be using a high voltage to excite an electron beam. Just like a general electronic element, an LED simply requires a voltage of 2~4 V to operate and thus being able to work at a normal temperature environment. While compared with the traditional tungsten light bulbs, it is believed that LEDs are certainly advantageous of having longer lifetime, higher luminous efficiency, lower failure rate, saving more power, and giving much more stable light. Also, the LEDs are highly compatible with various types of lamp devices. As a result, it is believed that the luminous life of LEDs is certainly to be much longer than that of the traditional light sources, thereby making the LEDs has successfully become a mainstream commodity in the market nowadays.

Normally, the LED die structures overall, mainly comprise a horizontal structure and a vertical structure. Regarding a vertical-structure LED, when compared with the horizontal-structure LED, the vertical-structure LED has more superior advantages of high brightness, rapid heat dissipation rate, small luminous decay and high stability. In view of device structure, photoelectric parameter, thermal property, luminous decay and fabrication cost, the vertical-structure LEDs also have much better heat dissipation effect than the horizontal-structure LEDs. And due to the great heat dissipation feature of the vertical-structure LEDs, the heat generated by the chip can always be dissipated in time, thereby minimizing the attenuation in performance of the chip and phosphor. As a result, it is believed that the LEDs are successfully characterized by high brightness, rapid heat dissipation rate, small luminous decay, and less drift of light color and thus are able to provide much more reliable stability.

However, in recent years, with the booming development, progress and evolution of semiconductor technologies, it is known that the current LED die structure is getting miniaturization, and the LED die size is also becoming smaller. For example, for a light emitting diode having a die size of 75 micrometers (μm), its electrode size of such die is merely 15 micrometers (μm). And meanwhile, in recent years, since the die structure size of the light emitting diodes are getting miniaturization, the packaging process of the LED dies are becoming much more difficult than before. In addition, due to the miniaturization of the die size, it also makes such a tiny die size very difficult to perform wire bonding procedure in the subsequent process. As a result, the packaging yield of the LED dies will be greatly affected and can not be well maintained.

For solving such issues, it is believed that the main solution lies in, how to find an alternative to replace the current wire bonding procedure when the LED die size is getting miniaturization. Such technical problems and existing deficiencies are eager to be solved. Therefore, it is believed that those skilled in the art are indeed in an urgent need of developing a novel and effective process method, so as to solve the problems of the above-mentioned prior art, and to optimize the packaging yield of the light emitting diode die.

Therefore, on account of above, in order to overcome the foregoing issues, it should be apparent that there is actually an essential need for the professionals in the field for a new and novel process method to be developed, that can not only effectively replace the current wire bonding procedure, but also make the packaging yield of the light emitting diode die optimized, which is a die packaging method to be disclosed in the present invention, especially for vertical light emitting diodes. And the detailed specific descriptions and implementations will be provided by Applicants of the present invention in the following paragraphs as below.

SUMMARY OF THE INVENTION

In order to overcome the above-mentioned disadvantages, one major objective in accordance with the present invention is provided for a novel process technology, which is a vertical LED (light emitting diode) die packaging method, as disclosed by Applicants of the present invention.

By employing the disclosed process techniques of the present invention, it is applicable to encapsulation process for packaging the vertical LED (light emitting diode) dies. Nevertheless, it is noted that the present invention is certainly not limited thereto. According to the process techniques of the present invention, it can be further widely applied to encapsulation process for alternative other crystal dies or grains. Many alternatives and modifications will be apparent to those skilled in the art, once informed by the present disclosure, and thus still fall into the claim scope of the present invention. By adopting the technical contents of the present invention, the existing external wire bonding process can be effectively replaced, and at the same time, the packaging yield of light emitting diode die can also be optimized.

And another objective of the present invention is to provide a vertical LED die packaging method, in which the nano silver wire ditches are formed and used to replace the current external wire bonding process. Therefore, the conventional packaging methods using wire bonding process can be avoided. In this way, the present invention may not only eliminate the deficiency of the light emitting diode dies when using the previous wire bonding packaging process, but also improve the reliability of the light emitting diode dies. And in addition, since the external wire bonding process is replaced by using the present invention, it is believed that a whole of the light emitting diode dies after encapsulation is also reduced. The inventive effect of packaging structure size miniaturization is therefore well accomplished by the present invention.

According to one embodiment of the present invention, a vertical LED (light emitting diode) die packaging method is proposed, including the following process steps. In the beginning, a substrate is provided. And a plurality of drill hole is formed in the substrate. Later, the plurality of drill hole is filled with a first metal material, and a second metal material is used to coat on an upper surface of the plurality of drill hole. After that, the present invention is able to dispose a plurality of vertical light emitting diode die and fix the plurality of vertical light emitting diode die on the substrate through the above-mentioned second metal material. Subsequently, a transparent glue is used to cover the plurality of vertical light emitting diode die and then a laser process is performed to dissolve the transparent glue such that a plurality of ditch is formed.

According to the embodiment of the present invention, each of the plurality of ditch is connected to at least one of the plurality of vertical light emitting diode die. Meanwhile, in the step of disposing the plurality of vertical light emitting diode die, the present invention may further comprise providing at least one dummy die, and the at least one dummy die is also fixed on the substrate through the second metal material. Under such a circumstance, it is believed that each of the ditches to be formed can be connected to one of the vertical light emitting diode dies and the dummy die.

After that, a conductive liquid is then applied to fill each of the plurality of ditch, and an insulating glue is at last provided to embrace the plurality of vertical light emitting diode die such that by using the insulating glue, the plurality of vertical light emitting diode die is completely encapsulated.

In one embodiment of the present invention, the above-mentioned first metal material is copper, and such first metal material can be filled in the plurality of drill hole, for instance, through a screen printing process or through an electroplating process.

In another aspect, the above-mentioned second metal material, for example, can be tin. And such second metal material can be coated on the upper surface of the plurality of drill hole, for instance, through a screen printing process or through a jet printing process.

In details, regarding the material of the transparent glue, it may be preferably made of negative UV resin. The parameters of the laser process used in the present invention for dissolving the negative UV resin material may include: a laser time is about 2 seconds to 3 seconds, such that it is a certain kind of laser process being able to reach an extremely high temperature instantaneously. Therefore, by adopting the laser process, the negative UV resin material can be effectively dissolved, so as to form the expected ditches. According to the embodiment, the depth of the formed ditch is approximately between 7 microns and 11 microns.

After that, the conductive liquid used by the present invention, for instance, can be made of nano silver wire, which has a solid content of 0.3%~0.4%. At this time, a direct contact (for example a blade) or an indirect contact (for example, a spin coater) may be used to coat the conductive liquid such that the conductive liquid can be filled in each of the plurality of ditch. Therefore, the present invention is able to successfully replace the existing external wire bonding process with the formed nano-silver wire ditches, thus effectively eliminating using the conventional packaging method for external wire bonding.

Moreover, when employing the die packaging method of the present invention, the plurality of vertical light emitting diode die, for example, may be selected from a group consisting of red, blue and green light emitting diode dies. However, it should also be noted that the present invention is certainly not limited to such wavelength range of LED dies (emitting red, blue or green lights). According to other embodiments of the invention, the vertical LED dies can also be composed as LED dies having various colors, or LED dies which emit white lights (visible lights) according to different preset wavelength bands. As a result, it is believed that the technical solutions disclosed in the present invention can be further widely applied, and not limited by the disclosed embodiment of the present invention.

It is apparent that by employing the die packaging method disclosed in the present invention, the volume of the packaging structure of the light emitting diode die formed by the present invention can be significantly reduced while compared with the prior art. Therefore, it is believed that not only the miniaturization for vertical LED die structure is accomplished, but also its packaging and encapsulation yield can be optimized. It is guaranteed that the present invention is characterized by having great industrial applicability and technical competitiveness in this related technical field.

Therefore, on the other hand, according to the die packaging method for the vertical light emitting diode dies disclosed in the present invention, it successfully achieves in eliminating the existing problems and defects in the packaging process in the current prior art. Therefore, it is believed that the present invention is not only highly competitive but may also be effectively and widely utilized in various related industries.

To sum up, based on the novel process techniques provided by Applicants of the present invention, the present invention has been verified as a new technology improvement with sophisticated design manners. Such an innovative process technique can not only be applied to the packaging process method for light emitting diode dies, but also can be used to successfully replace the current external wire bonding process of the prior arts. In addition, as compared with the prior arts, it is obvious that by employing the present invention, the miniaturization of the package volume of the light emitting diode dies can also be achieved significantly and effectively.

Below, the embodiments are described in detail in cooperation with the drawings, so that these and other objectives of the present invention will become obvious to those of ordinary skill in the art after reading the following detailed description of preferred embodiments. And technical contents, characteristics and accomplishments of the invention are easily comprehensive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
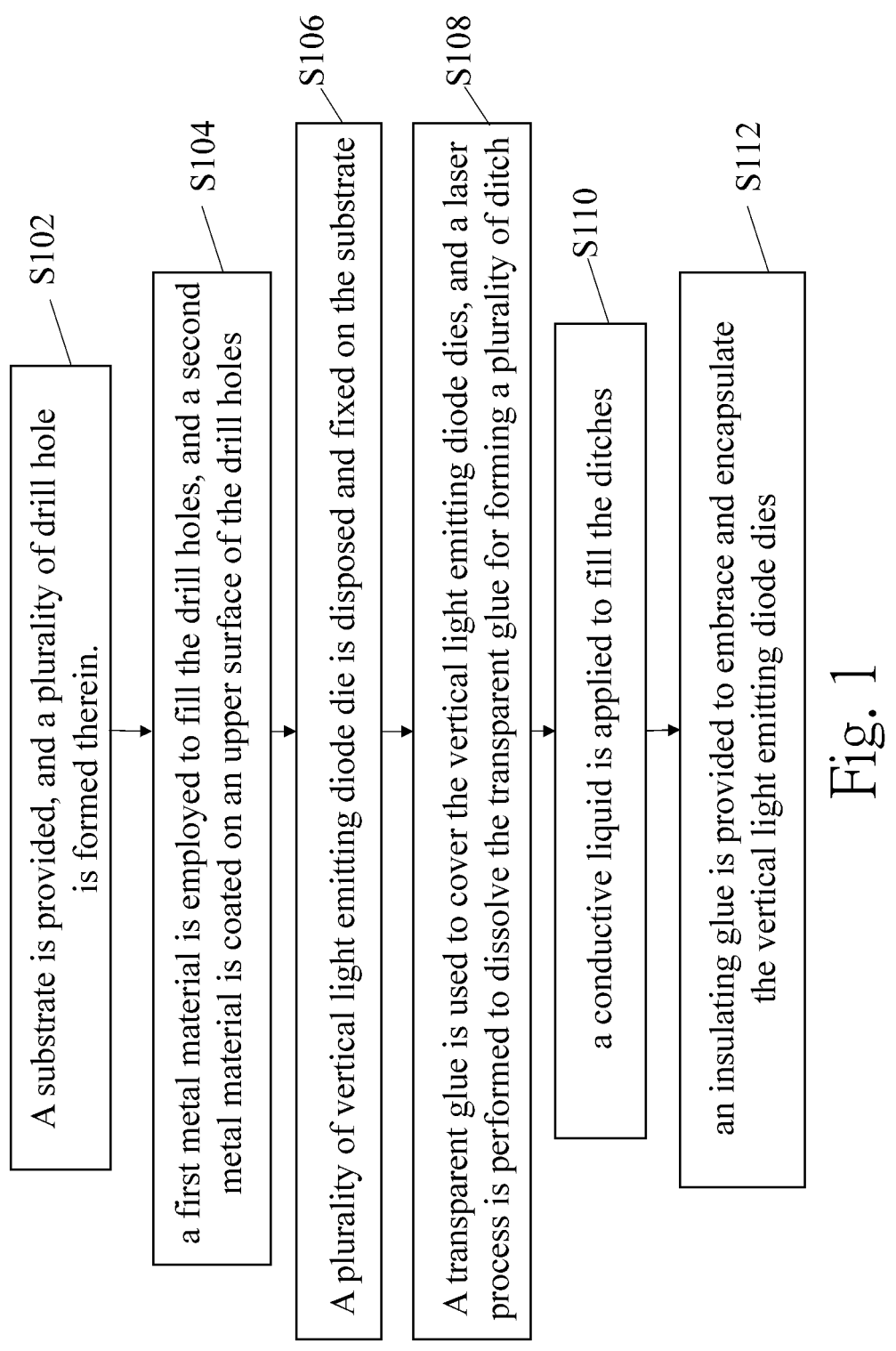
FIG. 1 shows a process flow chart illustrating the steps of the proposed vertical LED (light emitting diode) die packaging method in accordance with one embodiment of the present invention.

It is to be understood that both the foregoing general description and the following detailed description are exemplary and are intended to provide further explanation of the invention as claimed.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In the following paragraphs, the present invention is aimed to disclose a package structure of a light emitting diode (LED) die and its die packaging method thereof. The disclosed technical contents can be applied to the current existing vertical LED die packaging process and optimize the die size miniaturization trend of the LED package structure. In a further aspect, the disclosed LED die package structure and its die packaging method proposed in the present invention may also be widely applied to related alternative technical fields, so the present invention is not limited thereto the following embodiments.

Please refer to FIG. 1, which shows a process flow chart illustrating the steps of the proposed vertical LED (light emitting diode) die packaging method in accordance with the embodiment of the present invention. According to the packaging method, a plurality of following steps is provided:

In the step of S102: A substrate is firstly provided, and a plurality of drill hole is formed in the substrate.

In the step of S104: Later, a first metal material is employed to fill the plurality of drill hole, and a second metal material is coated on an upper surface of the plurality of drill hole.

In the step of S106: A plurality of vertical light emitting diode die is then disposed and fixed on the substrate through the above-mentioned second metal material.

In the step of S108: After that, a transparent glue is used to cover the plurality of vertical light emitting diode die, and a laser process is performed to dissolve the transparent glue such that a plurality of ditch is formed, wherein each of the plurality of ditch is connected to at least one vertical light emitting diode die.

In the step of S110: After the plurality of ditch is formed, a conductive liquid is applied to fill each of the plurality of ditch.

In the step of S112: And finally, an insulating glue is provided to embrace the plurality of vertical light emitting diode die such that the plurality of vertical light emitting diode die is encapsulated.

In order to enable those skilled in the art to have better understanding of the process method disclosed in the present invention, please refer to FIGS. 2A~2B, 3A~3B, 4A-4B, 5A-5B, 6, 7A~7B, 8A~8B, and 9, which accompanying show schematic structural views of the present invention for the following detailed description.

Figure 2A:
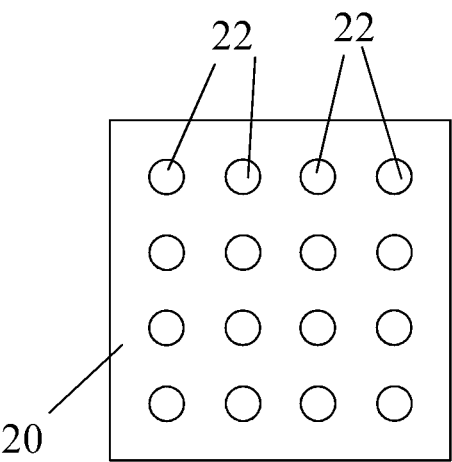
FIG. 2A and FIG. 2B show schematic structural diagrams of forming a plurality of drill hole in a substrate in accordance with the embodiment of the present invention.
Figure 2B:
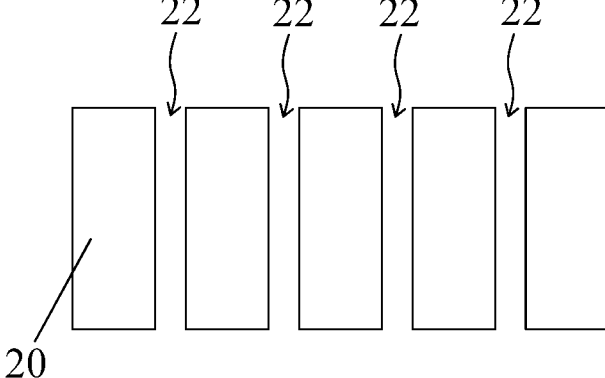

At first, as shown in FIG. 2A-2B, the present invention provides a substrate 20, and a plurality of drill hole 22 is formed in the substrate 20. According to the embodiment of the present invention, the plurality of drill hole 22, for instance, can be formed through laser drilling. The material of the substrate 20 used in the present invention can be, for example, a substrate made of glass. And a hole diameter of the drill hole 22 is approximately for instance, at least 60 μm (corresponding to the step S102).

Figure 3A:
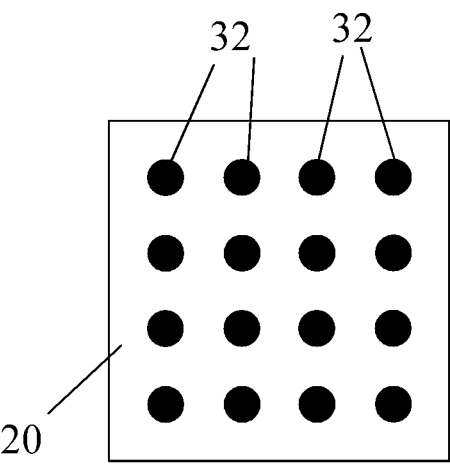
FIG. 3A and FIG. 3B show schematic structural diagrams of filling the plurality of drill hole with a first metal material in accordance with the embodiment of the present invention.
Figure 3B:
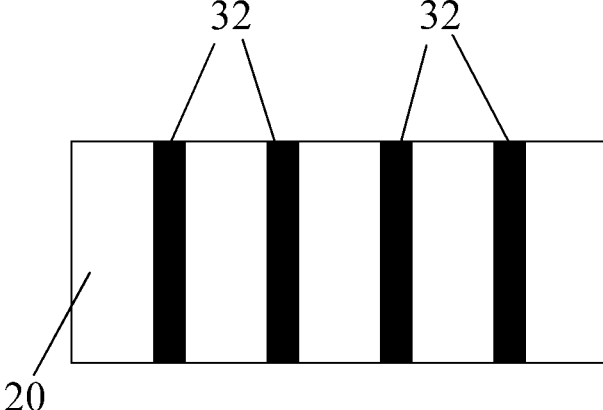
Figure 4A:
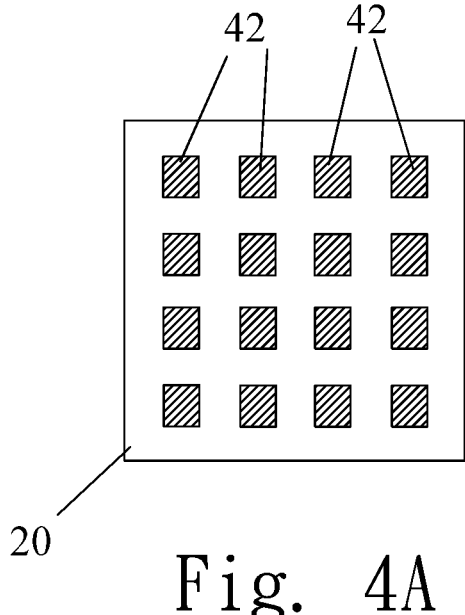
FIG. 4A and FIG. 4B show schematic structural diagrams of coating a second metal material on an upper surface of the plurality of drill hole in accordance with the embodiment of the present invention.
Figure 4B:
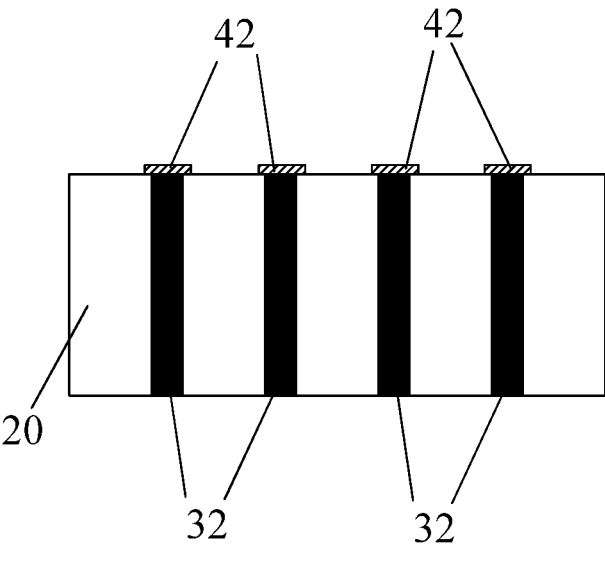

Later, as shown in FIG. 3A~3B, the present invention further provides a first metal material 32 to fill the plurality of drill hole 22. And after that, as shown in FIG. 4A~4B, a second metal material 42 is then employed and coated on an upper surface of the plurality of drill hole 22 (corresponding to the step S104). According to the embodiment of the present invention, the above-mentioned first metal material 32, for example, can be copper (Cu). And in the present invention, the copper can be filled into the plurality of drill hole 22 through a screen printing process or an electroplating process.

On the other hand, the above-mentioned second metal material 42, for example, can be tin (Sn). And, the tin material can be applied and coated on the upper surface of the plurality of drill hole 22 which has been filled with copper through a screen printing process or through a jet printing process.

Figure 5A:
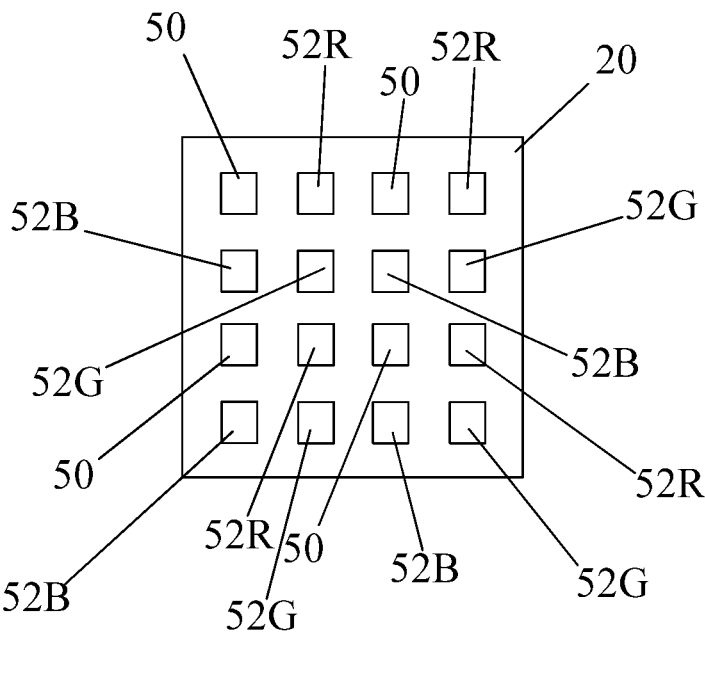
FIG. 5A and FIG. 5B show schematic structural diagrams of disposing and fixing a plurality of vertical light emitting diode die on the substrate through the second metal material in accordance with the embodiment of the present invention.
Figure 5B:
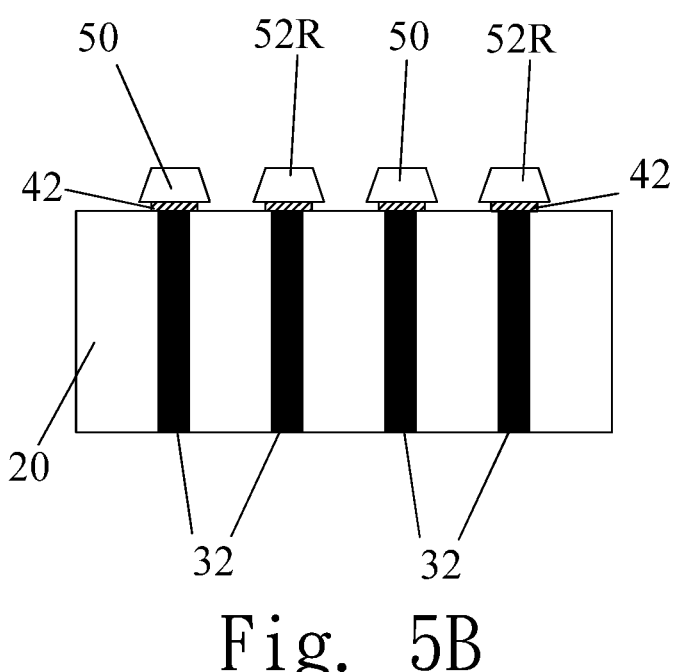

And then, please refer to FIG. 5A and FIG. 5B, which show the schematic structural diagrams of fixing a plurality of light emitting diode (LED) die on the substrate in accordance with the embodiment of the present invention. As illustrated in the step of S106 in FIG. 1, the present invention further disposes a plurality of vertical light emitting diode (LED) die and fix the plurality of vertical LED die on the foregoing substrate 20 through the second metal material 42. For example, according to the process method disclosed in the present invention, these vertical light emitting diode (LED) dies as shown in FIG. 5A may be selected from a group consisting of red light emitting diode die 52R, blue light emitting diode die 52B and green light emitting diode die 52G. It should be noted that, at the same time, the present invention simultaneously provides at least one dummy die 50. In addition, the dummy die 50 is also fixed on the substrate 20 through the foregoing second metal material 42. It should also be noted that, the present invention is not limited to the outline appearance, height, or shape of the dummy die 50. However, in general, in order to comply with the requirement of mass transfer of the LED dies in the subsequent packaging process, the configuration arrangement relationship between the dummy die 50 and its adjacent red light emitting diode die 52R, blue light emitting diode die 52B and green light emitting diode die 52G and these die appearances should have certain consistency and incoherence, and nevertheless, the present invention is not limited to these conditions. In addition, the vertical light emitting diode dies mentioned in the present invention are not limited to being composed of red, blue, or green LED dies. In alternative embodiments of the present invention, the vertical light emitting diode dies may also comprise light emitting diode dies of non-pure colors. Moreover, regarding the number of red, blue, and green light emitting diode dies, or their configuration arrangement patterns (for example, the arrangement is in an L-shaped pattern in this embodiment, or it may also be arranged in a straight line in other embodiments), the present invention is also not limited thereto by the illustrative embodiments. For people who are skilled in the art and with ordinary knowledge in the field, modifications without departing from the spirit of the present invention are permitted. However, within the scope of its equality, it is believed that such modifications should still fall into the scope and claims of the present invention.

Figure 6:
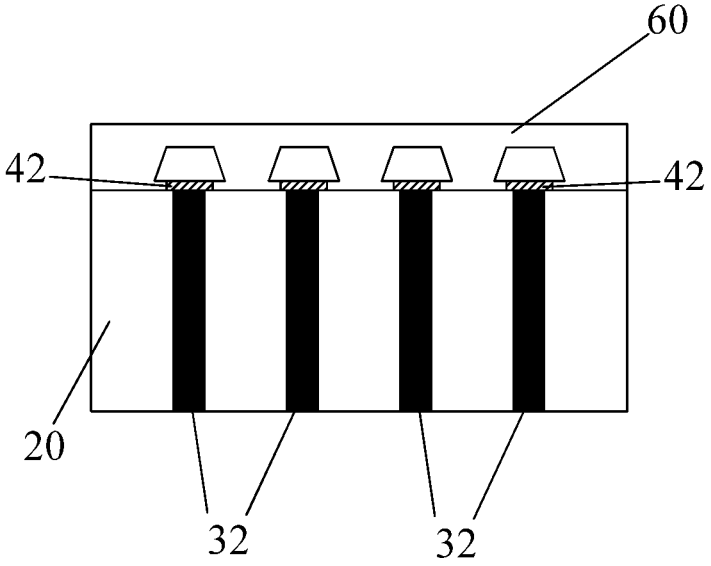
FIG. 6 shows a schematic structural diagram of covering the plurality of vertical light emitting diode die with a transparent glue in accordance with the embodiment of the present invention.
Figure 7A:
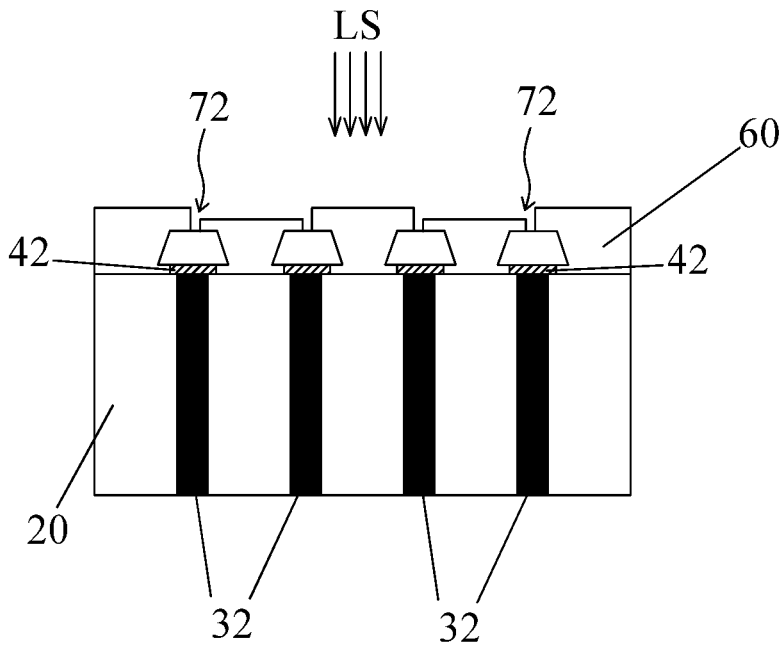
FIG. 7A and FIG. 7B show schematic structural diagrams of performing a laser process to dissolve the transparent glue for forming a plurality of ditch in accordance with the embodiment of the present invention.
Figure 7B:
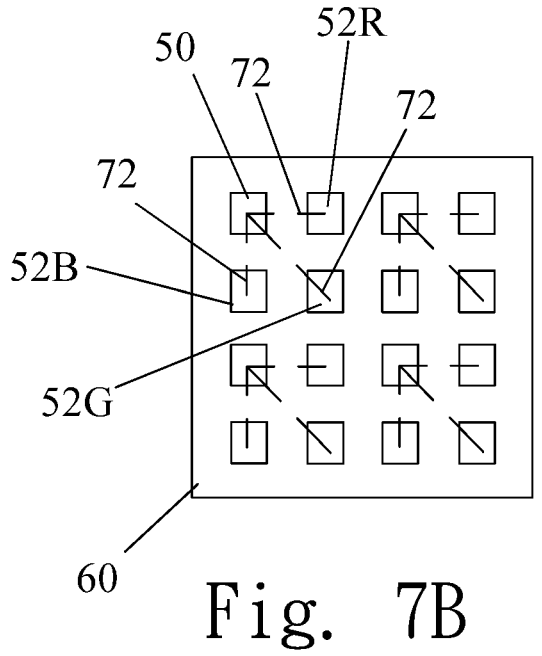

And then, after the step S106 of fixing the vertical LED dies is complete, the present invention further proceeds to perform the step S108 to cover these vertical light emitting diode dies with a transparent glue 60 (as shown in FIG. 6). According to the embodiment of the present invention, the transparent glue 60, for instance, may be made of negative UV resin. As known, the negative UV resin is characterized by being transparent and colorless, and thus, based on such technical features, when the laser process LS in FIG. 7A is performed, it could be easy and accurate to find and identify the position to be cut in the subsequent laser process LS. Therefore, after the laser process LS in FIG. 7A is complete, the present invention is able to dissolve the transparent glue 60 through the laser process LS such that a plurality of ditch 72 is formed. Furthermore, as can be seen in FIG. 7B, it is obvious that each of the ditches 72 is connected to one vertical light emitting diode die 52R, 52B, 52G and the dummy die 50. In FIG. 7B of the present invention, the ditch 72 formed by dissolving the negative UV resin is illustrated by using the dotted line.

In one embodiment of the present invention, the laser process LS performed in the present invention is able to provide an instantaneous high temperature in an extremely short time. For example, a laser time for performing the laser process is between 2 seconds and 3 seconds, so as to enable one of the plurality of ditch 72 to be formed has a depth between 7 μm and 11 μm.

To be more specific, according to the embodiment of the present invention, when the above-mentioned negative UV resin is dissolved to form the ditches 72 due to the laser process LS, the negative UV resin disposed at the bottom of the ditches 72 may be softer. As a result, those skilled in the art may practically further use a solvent for about 10 to 15 minutes to dissolve the unreacted resin in this area, and afterwards, use deionized water to rinse the area for forming the above-mentioned ditches 72.

Figure 8A:
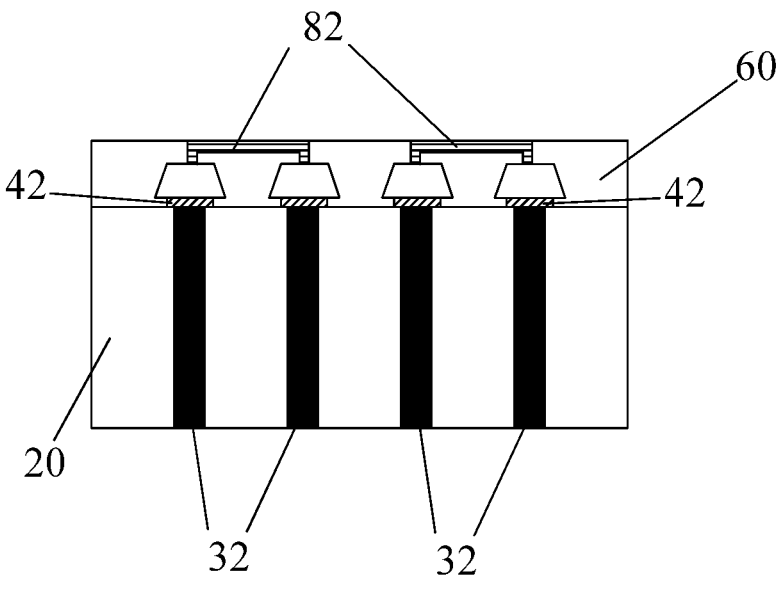
FIG. 8A and FIG. 8B show schematic structural diagrams of applying a conductive liquid to fill the plurality of ditch for forming a plurality of conductive silver wire in accordance with the embodiment of the present invention.
Figure 8B:
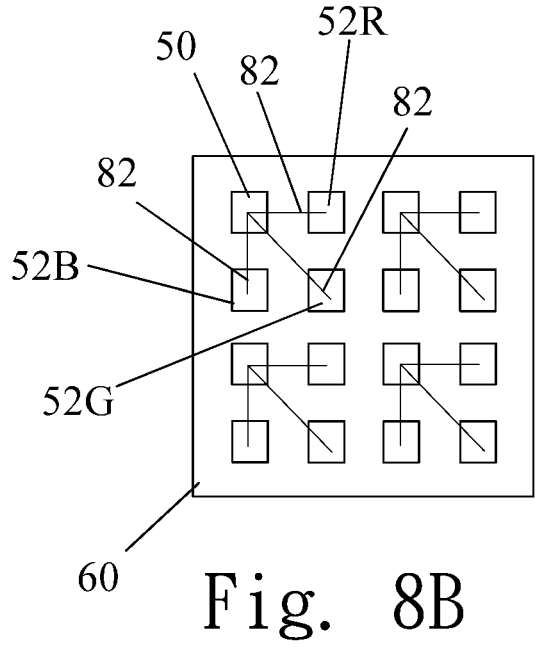

And subsequently, as shown in the step of S110 in FIG. 1, the present invention further applies a conductive liquid after the above-mentioned ditches 72 are formed, such that the conductive liquid is able to fill each of the plurality of ditch 72. According to one preferred embodiment of the present invention, the conductive liquid for instance, may be made of nano silver wire having a solid content of 0.3%~0.4%. And the conductive liquid can be provided through using a direct contact (for example a blade) or an indirect contact (for example, a spin coater) for coating the conductive liquid such that the conductive liquid fills in each of the plurality of ditch 72. As a result, as can be seen in FIG. 8A and FIG. 8B, the conductive silver wires 82 are successfully formed. Specifically, in FIG. 8B of the present invention, the conductive silver wires 82 formed after the conductive liquid is coated in the ditches are illustrated by using the solid line. Based on such technical features, the present invention achieves to provide and form the conductive silver wires 82 by employing the conductive liquid (i.e. the nano silver wires), and the formed conductive silver wires 82 can thus be effectively used to replace the current wire bonding procedure even when the LED die size is getting miniaturization nowadays. Meanwhile, it is believed that by employing the present invention, packaging criteria for much more miniaturized die size can be satisfied as well.

Figure 9:
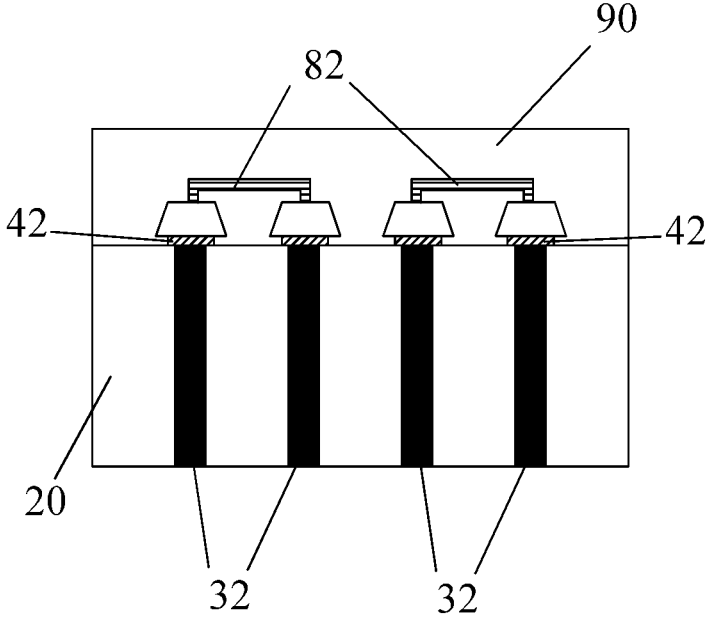
FIG. 9 shows a schematic structural diagram of providing an insulating glue to embrace the plurality of vertical light emitting diode die for encapsulation in accordance with the embodiment of the present invention.

And therefore, at last, as shown in the step of S112 in FIG. 1, the present invention is able to provide an insulating glue 90, as illustrated in FIG. 9, and to adopt the insulating glue 90 so as to embrace these plurality of vertical light emitting diode die. As a result, the plurality of vertical light emitting diode die is successfully encapsulated. Among them, according to one embodiment of the present invention, the insulating glue 90 used, for example, may be made of silicone or epoxy. And in a further aspect of the invention, in order to increase the visual contrast effect, the insulating glue 90, preferably, can also be used as a color of black silicone or black epoxy.

As a result, to sum up, it is apparent that according to the disclosed process method of the present invention, the laser process is performed to form the ditches. And after the ditches are formed, the conductive liquid (made of nano silver wires) can be applied and coated in the ditches such that the above-disclosed conductive silver wires are formed and thus can be used for replacing the current wire bonding procedure when the LED die size is moving in a miniaturization trend. Under such circumstances, it is believed that, by employing the present invention, not only the existing wire bonding process can be substituted and packaging criteria for much more miniaturized die size can be satisfied, but also the yield for packaging the vertical light emitting diode dies can be optimized. Apart from these, the whole packaging structure after the vertical light emitting diode dies are encapsulated is effectively reduced. The present invention is thus beneficial in providing inventive effect of packaging structure size miniaturization.

Based on above, it is ensured that by employing the vertical light emitting diode die packaging method of the present invention, it is aimed to provide a novel process technique and to optimize the existing packaging processes. By such process manners, as compared with the current technologies, it is believed that the present invention and process methods being proposed are able to effectively solve the issues existing in the prior arts and to provide much more superior process efficiency. In addition, the proposed process method of the present invention can be applied to not only general light emitting diode dies, but also any various related electronic circuit components in the semiconductor industry, integrated circuit industry, or power electronics industry. In view of all, the Applicants assert that the present invention is instinct, effective and highly competitive for incoming technologies, industries and researches developed in the future. And since the technical features, means and effects achieved by the present invention are significantly different from the current solutions, and can not be accomplished easily by those who are familiar with the industry, it is thus believed that the present invention is indeed characterized by patentability and shall be patentable soon in a near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A vertical LED (light emitting diode) die packaging method, comprising:

providing a substrate and forming a plurality of drill hole in the substrate;

filling the plurality of drill hole with a first metal material, and coating a second metal material on an upper surface of the plurality of drill hole;

disposing a plurality of vertical light emitting diode die and fixing the plurality of vertical light emitting diode die on the substrate through the second metal material;

covering the plurality of vertical light emitting diode die with a transparent glue and performing a laser process to dissolve the transparent glue such that a plurality of ditch is formed, wherein each of the plurality of ditch is connected to at least one of the plurality of vertical light emitting diode die;

applying a conductive liquid to fill each of the plurality of ditch, and the conductive liquid is made of nano silver wire; and providing an insulating glue to embrace the plurality of vertical light emitting diode die such that the plurality of vertical light emitting diode die is encapsulated.

2. The vertical LED die packaging method according to claim 1, wherein in the step of disposing the plurality of vertical light emitting diode die, further comprising provid-ing at least one dummy die, and the at least one dummy die is also fixed on the substrate through the second metal material.

3. The vertical LED die packaging method according to claim 2, wherein each of the plurality of ditch is connected to one of the plurality of vertical light emitting diode die and the dummy die.

4. The vertical LED die packaging method according to claim 1, wherein the first metal material is copper.

5. The vertical LED die packaging method according to claim 1, wherein the first metal material is filled in the plurality of drill hole through a screen printing process or an electroplating process.

6. The vertical LED die packaging method according to claim 1, wherein the second metal material is tin.

7. The vertical LED die packaging method according to claim 1, wherein the second metal material is coated on the upper surface of the plurality of drill hole through a screen printing process or a jet printing process.

8. The vertical LED die packaging method according to claim 1, wherein the plurality of vertical light emitting diode die is selected from a group consisting of red, blue and green light emitting diode dies.

9. The vertical LED die packaging method according to claim 1, wherein the transparent glue is made of negative UV resin.

10. The vertical LED die packaging method according to claim 1, wherein a laser time for performing the laser process is between 2 seconds and 3 seconds, and one of the plurality of ditch to be formed has a depth between 7 μm and 11 μm.

11. The vertical LED die packaging method according to claim 1, wherein the insulating glue is made of silicone or epoxy.

12. The vertical LED die packaging method according to claim 1, wherein the substrate is made of glass.

13. The vertical LED die packaging method according to claim 1, wherein a hole diameter of one of the plurality of drill hole is at least 60 μm.

14. The vertical LED die packaging method according to claim 1, wherein a blade or a spin coater is used to coat the conductive liquid such that the conductive liquid fills each of the plurality of ditch.

* * * * *